(12) United States Patent
Yoshimura

(10) Patent No.: US 7,250,808 B2
(45) Date of Patent: Jul. 31, 2007

(54) DIFFERENTIAL CHARGE PUMP CIRCUIT

(75) Inventor: Tsutomu Yoshimura, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 76 days.

(21) Appl. No.: 10/916,481

(22) Filed: Aug. 12, 2004

(65) Prior Publication Data

US 2005/0162213 A1 Jul. 28, 2005

(30) Foreign Application Priority Data

Jan. 22, 2004 (JP) ............................. 2004-014533

(51) Int. Cl.
*G05F 1/10* (2006.01)
*H03L 7/06* (2006.01)
(52) U.S. Cl. .................................. 327/536; 327/148
(58) Field of Classification Search ............... 327/147, 327/148, 156, 157
See application file for complete search history.

(56) References Cited

U.S. PATENT DOCUMENTS

| 5,736,880 | A  | * | 4/1998  | Bruccoleri et al. ......... 327/157 |
| 6,011,822 | A  | * | 1/2000  | Dreyer ........................ 375/376 |
| 6,181,210 | B1 | * | 1/2001  | Wakayama .................... 331/8 |
| 6,483,358 | B2 | * | 11/2002 | Ingino, Jr. ................... 327/157 |
| 6,744,292 | B2 | * | 6/2004  | Chen et al. .................. 327/156 |
| 6,815,988 | B2 | * | 11/2004 | Sanduleanu ................. 327/157 |
| 6,900,677 | B2 | * | 5/2005  | Cho .......................... 327/157 |
| 6,952,126 | B2 | * | 10/2005 | Byun et al. .................. 327/157 |
| 7,012,473 | B1 | * | 3/2006  | Kokolakis ..................... 331/17 |
| 7,030,688 | B2 | * | 4/2006  | Dosho et al. ................ 327/558 |
| 2003/0107419 | A1 | * | 6/2003 | Park ........................... 327/157 |
| 2003/0107420 | A1 | * | 6/2003 | Hsu et al. .................... 327/157 |
| 2004/0130364 | A1 | * | 7/2004 | Suzuki ........................ 327/157 |
| 2005/0017776 | A1 | * | 1/2005 | Keaveney et al. ........... 327/157 |
| 2005/0162200 | A1 | * | 7/2005 | Haerle ......................... 327/157 |
| 2005/0189973 | A1 | * | 9/2005 | Li ............................... 327/157 |
| 2005/0237091 | A1 | * | 10/2005 | Lindner et al. ............. 327/157 |

FOREIGN PATENT DOCUMENTS

JP 2001-111421 A 4/2001

OTHER PUBLICATIONS

Johns, David A., et al. "Analog Integrated Circuit Design." John Wiley & Sons, Inc. 1997, pp. 3.
Henrickson, L., et al "Low-Power Fully Integrated 10-Gb/s SONET/SDH Transceiver in .13-µm CMOS." IEEE Journal of Solid-State Circuits, vol. 38, No. 10, Oct. 2003, pp. 1595-1601.

* cited by examiner

*Primary Examiner*—Quan Tra
*Assistant Examiner*—Rey Aranda
(74) *Attorney, Agent, or Firm*—McDermott Will & Emery LLP

(57) ABSTRACT

A differential charge pump circuit has two current paths and generates a differential current in accordance with currents inputted to the two current paths. The two current paths have a pair of current sources respectively and form a differential pair. The differential charge pump circuit has controlling means for detecting an output potential difference between the two current paths and controlling current values of the current sources in accordance with the output potential difference.

1 Claim, 5 Drawing Sheets

DIFFERENTIAL CHARGE PUMP CIRCUIT

BACKGROUND OF THE INVENTION

1. Field of the Invention

The present invention relates to an differential charge pump circuit, and more particularly, to an differential charge pump circuit with a current drive property of not depending on the output potential difference.

2. Background Art

Conventional differential charge pump circuits are structured as shown in FIG. 7. That is, along with connecting a first current path 1 including current sources 11 and 12 and a second current path 2 including current sources 21 and 22 between a power source VDD and a ground GND, a differential pair 3 is formed; and a DOWN signal circuit 5 and an UP signal circuit 7, which are connected to a constant current source 4, are connected to a positive node 6 of the first current path 1 and to a negative node 8 of the second current path 2 respectively.

In a structure as mentioned above, the UP/DOWN signals are converted to current signals and passed on to the differential pair 3; by extracting the current from the two current paths 1 and 2, the current which flows through one of the two current paths is changed relatively to the other current path and a differential current is generated; and conversion from voltage signals to current signals is carried out. In the case where the electric potentials of the positive node 6 of the first current path and the electric potential of the negative node 8 of the second current path are not equal during operation, the drain voltages of the transistor (graphic representation not given) which comprise the current sources 11 and 12 become different from each other, and an imbalance between the currents of the current sources 11 and 12, which are the opposite current sources in the first and second current paths 1 and 2, occurs.

The imbalance in the current is caused by the dependence of the current characteristics of the saturated area of the MOS transistor on the drain current. The relation between the drain current $I_D$ of the transistor, the gate voltage $V_{GS}$, the drain voltage $V_{DS}$, and the threshold voltage $V_{TH}$ may be explained by the undermentioned equation (for example, refer to David Johns & Ken Martin, "Analog Integrated Circuit Design", published 1997 by John Wiley & Sons, Inc.):

$$I_D = K_O(V_{GS} - V_{TH})^2 [1 + \lambda(V_{DS} - (V_{GS} - V_{TH}))]$$

That is, since the drain current value has the characteristic of depending on the drain voltage, to explain referring to FIG. 8 which shows the detailed structure of each of the current sources in FIG. 7, in the case where there is a difference between the electric potentials of the output nodes 6 and 8 of the differential pair 3, the current values of the current sources 11 and 12, and the current sources 12 and 22, which are the opposite current sources in the first and second current paths 1 and 2, become respectively different. In the drawing, the broad arrows indicate that the current is large; and the thin arrows indicate that the current is small.

If the electric potential of the positive node 6 is higher than the electric potential of the negative node 8, between the NMOS current sources 12 and 22, current flows more through the first current path 1 of the positive node 6 (to which the positive node 6 belongs).

In this drawing, the constant-current property is improved by forming the two MOS transistors of both the PMOS side and the NMOS side in a cascode configuration; however, actually, a certain amount of electric potential difference remains between the nodes X and Y, and between the nodes Z and W. In the case where the cascode configuration is not employed, it may be considered that the electric potential differences would become even larger.

On the other hand, as for the PMOS current sources 11 and 21, since the electric potential difference between the drain and the source is larger in the second current path 2 of the negative node 8 (to which the negative node 8 belongs) than in the first current path 1, current flows more in the current source of the second current path 2. Accordingly, taking both the NMOS and the PMOS into consideration, more current flows through the positive node 6 towards the GND (i.e., the NMOS current source 12 carries more current), and more current flows through the negative node 8 towards the VDD (i.e., the PMOS current source 21 carries more current). As a result of this, in the case where there is a difference in the output potentials of the differential pair 3, the charge pump characteristics depend largely on the electric potential difference.

As a result of this, for example, in a case where the above-mentioned differential charge pump circuit is applied to a charge pump circuit of a PLL circuit, the phase comparison characteristic changes according to the output potential difference of the charge pump circuit.

Generally, the phase comparator of a PLL circuit transmits a pulse signal according to the phase difference between the reference clock (or the data) and the feedback clock to the charge pump circuit; and the charge pump circuit outputs a current value according to the pulse signal thereof. Ideally, the phase difference and the current amount flowing through the charge pump circuit should correspond one-to-one regardless of the output potential of the charge pump circuit.

FIG. 9 is a graph showing the result from circuit-simulating the phase comparison characteristic of the PLL circuit when the output potential difference of the differential charge pump circuit is varied. The horizontal axis represents the phase difference between the reference clock (or the data) and the feedback clock expressed by time; and the vertical axis shows the average value of the current flowing through the charge pump circuit in each of the phases. When the average current of the charge pump circuit is zero, the PLL circuit becomes locked. Accordingly, the phase difference at that time shows the phase error (i.e., the offset of the reference clock (or the data) and of the feedback clock) when the PLL circuit is locked.

Since the current value of the constant current source of the conventional differential charge pump circuit differs depending on the output potential difference of the charge pump as mentioned above, the phase error at a locked time when the output potential difference of the charge pump circuit is varied changes according to the output potential difference of the charge pump circuit. In the simulation shown in FIG. 9, at the variation of ±0.1 V of the output potential difference (electric potential of positive node minus electric potential of negative node), the phase error change is about 5 ps.

Since the conventional differential charge pump circuit is structured as mentioned above, the precision of the phase adjustment of the PLL circuit deteriorates due to the phase error change shown in the simulation in FIG. 9, and this creates a great problem in the high-speed interface DLL (Delay-Locked-Loop: phase adjustment loop) circuit, or a CDR (Clock and Data Recovery) circuit, which necessitate high-precision phase adjustment.

SUMMARY OF THE INVENTION

The present invention has been devised to solve problems as mentioned above, and has as its intention the provision of an differential charge pump circuit which is capable of canceling the change in the driving current due to change in the drain voltage of the transistor of the current source, and which may carry out phase adjustment of the PLL circuit or the like accurately.

A differential charge pump circuit has two current paths and generates a differential current in accordance with currents inputted to the two current paths. The two current paths have a pair of current sources respectively and form a differential pair. The differential charge pump circuit has controlling means for detecting an output potential difference between the two current paths and controlling current values of the current sources in accordance with the output potential difference.

Since the differential charge pump circuit in accordance with the present invention is composed as described above, it is possible to cancel the change in the driving current according to the change in the drain voltage of the transistor of the current source, and carry out phase adjustment of the PLL circuit or the like accurately.

These and other objects, features, and advantages of the present invention will become more apparent in light of the following detailed description thereof, as illustrated in the accompanying drawings.

DETAILED DESCRIPTION OF THE PREFERRED EMBODIMENTS

First Embodiment

Figure 1:
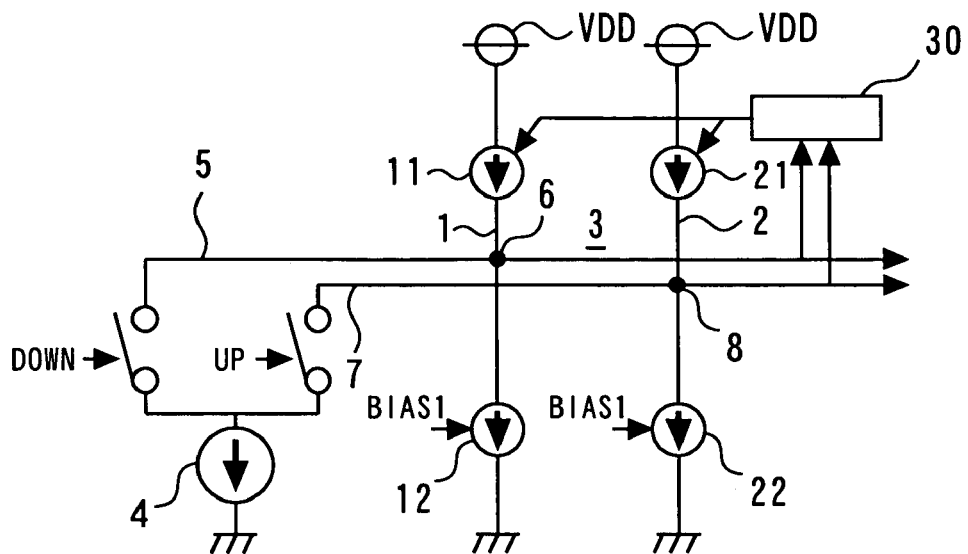
FIG. 1 is a schematic circuit diagram for explaining the basic idea of a first embodiment of the present invention.
Figure 2:
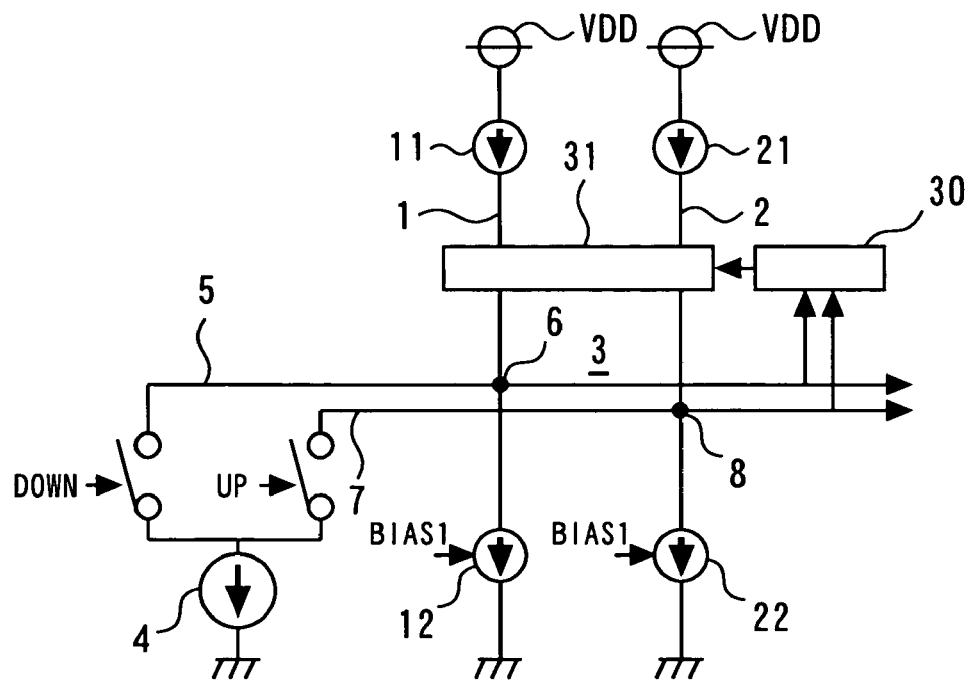
FIG. 2 is a schematic circuit diagram for illustrating an example of the embodiment in accordance with the first embodiment of the present invention.
Figure 7:
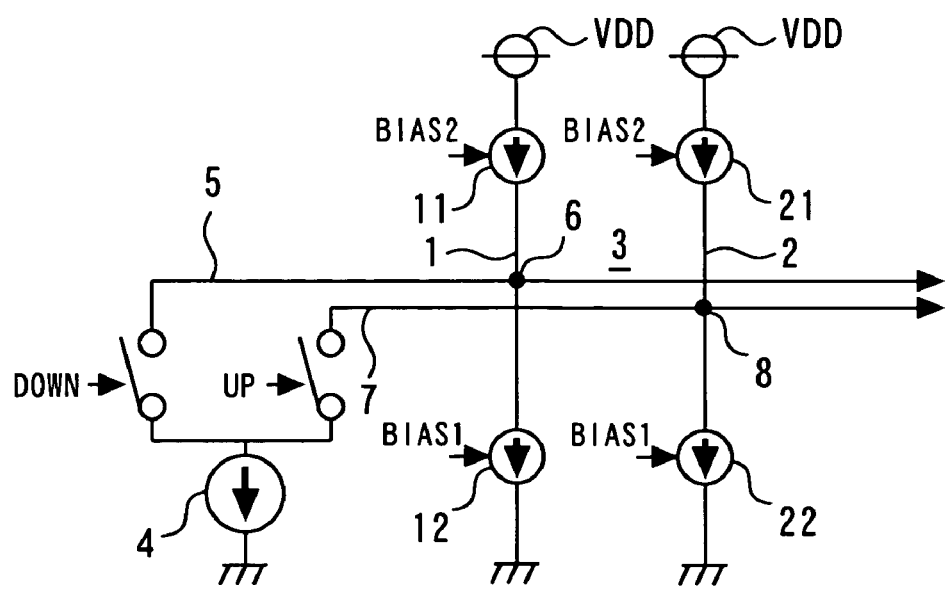
FIG. 7 is a schematic circuit diagram for illustrating the structure of a conventional differential charge pump circuit.
Figure 8:
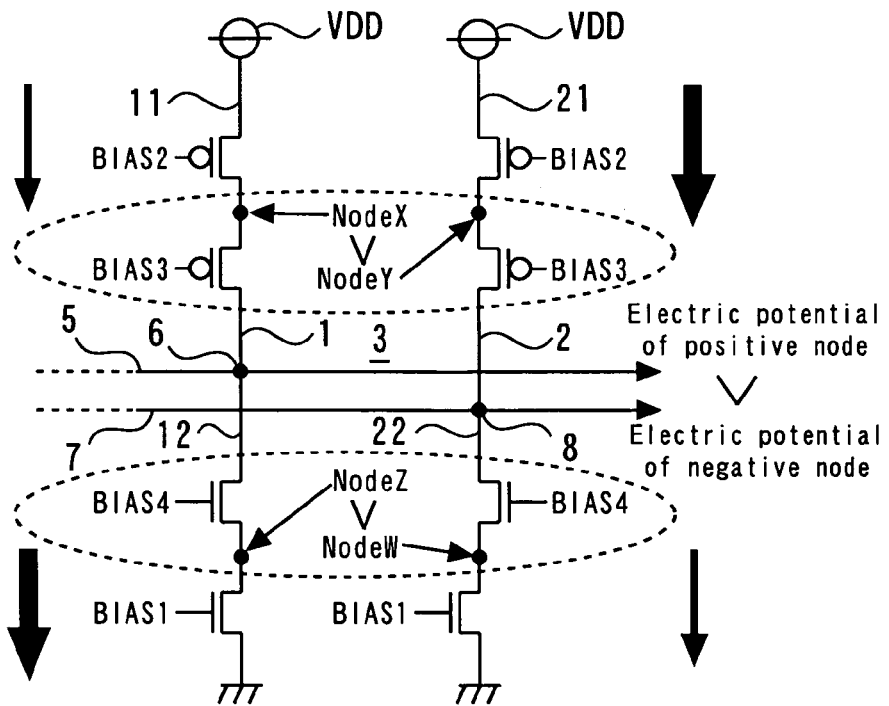
FIG. 8 is a circuit diagram for illustrating the detailed structure of each of the current sources in FIG. 7.

The following is an explanation of the first embodiment based on the drawings. FIG. 1 is a schematic circuit diagram for explaining the basic idea of the first embodiment of the present invention; and FIG. 2 is a schematic circuit diagram showing an example of the embodiment in accordance with the first embodiment of the present invention. In FIGS. 1 and 2, the same numerals are given to the same parts or the corresponding parts in FIG. 7, and repeated explanation will be appropriately omitted. FIG. 1 is different from FIG. 7 in that a controlling device 30 for detecting the output potential difference of the differential charge pump circuit, i.e., the electric potential difference between the positive node 6 and the negative node 8 is provided, and in that both of the current sources are made to be of the same current driving force by controlling the currents of the current sources 11 and 12 with this controlling device 30 according to the above-mentioned electric potential difference.

In FIG. 2, an element 31 such as a transistor for controlling the drain voltage is connected to both of the current sources 11 and 21, and along with detecting the output potential difference between the positive node 6 and the negative node 8 of the differential charge pump circuit with the controlling device 30, the current sources 11 and 21 are made to be of the same current driving force by controlling the drain voltage of the element 31 which controls the drain voltage according to the above-mentioned output potential difference with the controlling device 30.

Figure 3:
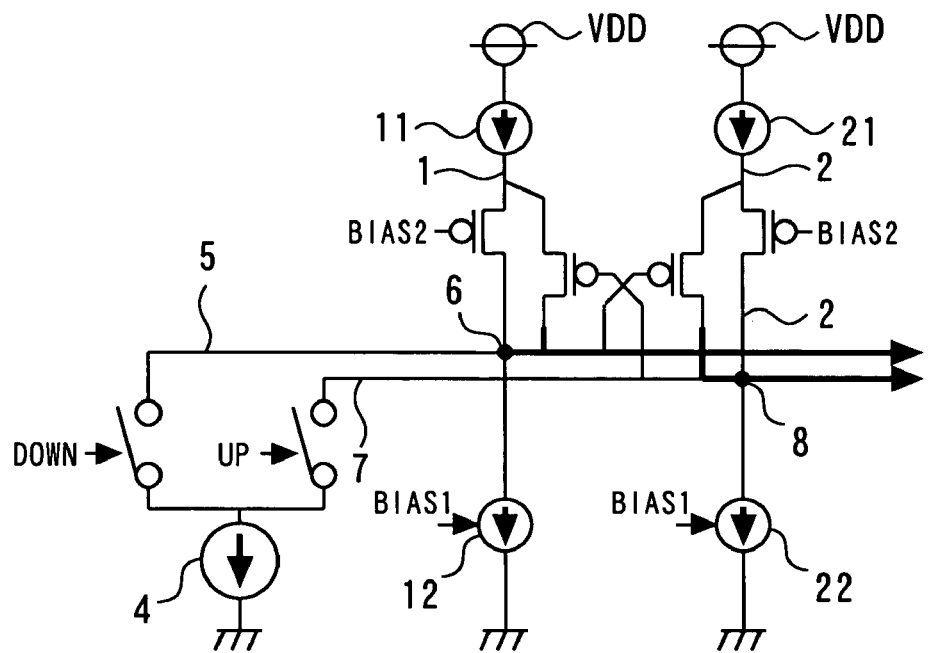
FIG. 3 is a circuit diagram for illustrating an alternative example in accordance with the first embodiment of the present invention.

FIG. 3 is a circuit diagram showing an alternative example of the first embodiment; and detection of the output potential difference between the positive node 6 and the negative node 8, and current-value control of the current sources 11 and 21 are carried out together by providing two cross-coupled MOS transistors on the two current paths 1 and 2.

Figure 4:
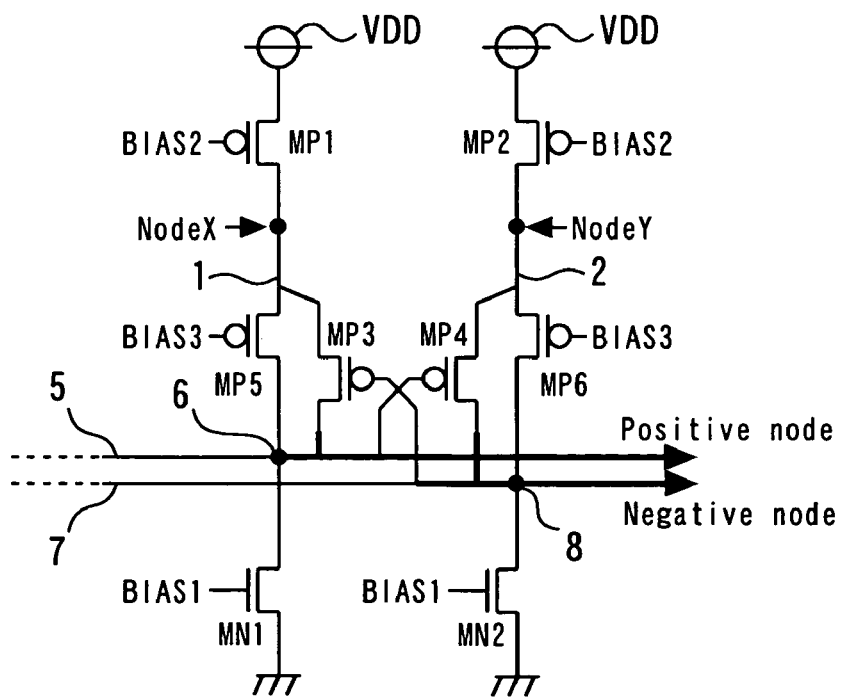
FIG. 4 is a circuit diagram for illustrating detailed structures of the output potential difference detecting part and of the controlling part of FIG. 3.

FIG. 4 is a circuit diagram showing the detailed structure of the electric-potential-difference detection part and the controlling part of the current sources in FIG. 3. Hereinafter, explanation is given assuming that the charge pump circuit in FIG. 4 is applied to a PLL circuit, and that the PLL circuit is in a lock state in which, for example, the electric potential of the positive node 6 is higher than the electric potential of the negative node 8.

The MOS transistor pair MP1 and MP5 which comprise the PMOS side of the first current path 1 and the MOS transistor pair MP2 and MP6 which comprise the second current path are both formed in a cascode configuration, and have a high constant-current property against the positive and negative nodes 6 and 8. However, to be accurate, since the transistors MP1 and MP2 have a certain and limited amount of output impedance, in the case where transistors MP3 and MP4 do not exist, the voltage of the node X becomes greater than the voltage of the node Y. This unequalness in the drain voltages causes the difference in the currents that flow.

The transistors MP3 and MP4 have their gate terminal connected to each other's drain terminal, and form a cross-couple. Since in the case where the electric potential of the positive node 6 is higher than the electric potential of the negative node 8 the gate voltage of MP3 is lower than the gate voltage of MP4, it is possible to say that MP3 is more in the ON-state. In other words, MP3 has a larger current driving force than MP4. By these two transistors MP3 and MP4, in the case where the positive node 6 is higher in electric potential than the negative node 8, the ON resistance generated by MP3 and MP5 which are between the node X and the positive node 6 becomes lower than the ON resistance generated by MP4 and MP6 which are between the node Y and the negative node 8.

Accordingly, even in the case in which the electric potential of the positive node 6 is higher than the electric potential of the negative node 8, the voltage of the node X and the voltage of the node Y may be equalized by adjusting the size of MP3 and MP4.

As a result of this, it is possible to equalize the value of the voltage of the nodes X and Y regardless of the electric potential difference of the positive and negative nodes 6 and 8, and the current driving force of the transistors MP1 and MP2 becomes the same.

Furthermore, similar adjustment is possible, for example, in the case where the constant-current property of the transistors MN1 and MN2 of the NMOS side creates a problem. For example, in the case where the electric potential of the positive node 6 is higher than the electric potential of the negative node 8, the drain current of MN1 becomes greater than the drain current of MN2. Accordingly, by adjusting the size of MP3 and MP4, inversely, the voltage of the node X is made to be lower than the voltage of the node Y.

Accordingly, the drain current of the transistor MP1 becomes greater than the drain current of MP2. By adjusting the size of MP3 and MP4 so that the current increase of MN1 in relation to MN2 becomes the same as the current increase of MP1 in relation to MP2, offset current due to the current imbalance caused by the output potential difference of the differential charge pump circuit may be cancelled as a whole.

Figure 6:
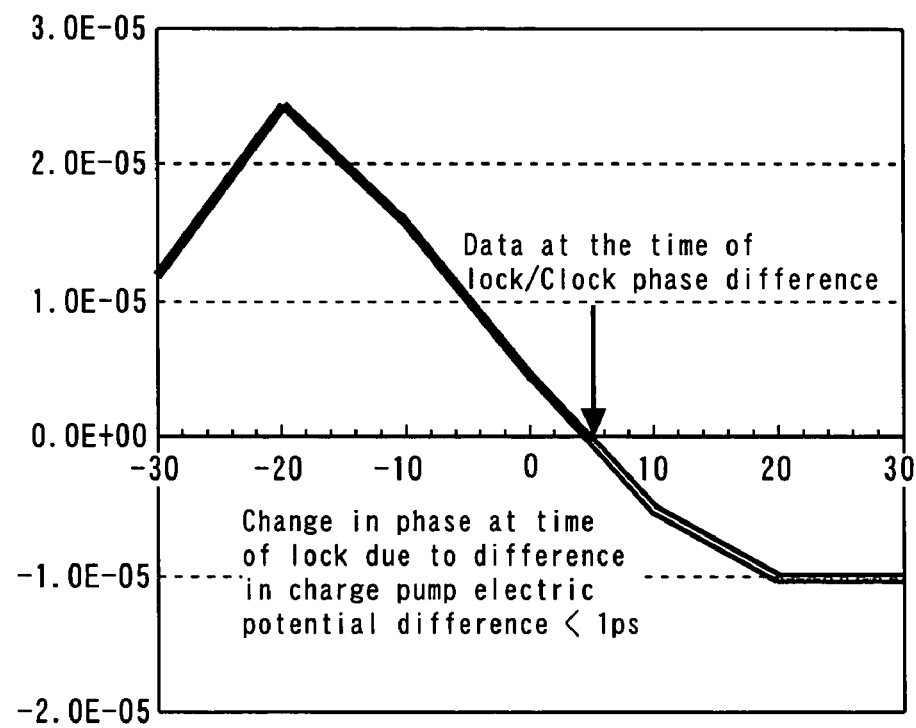
FIG. 6 is a drawing for representing the simulation results of phase comparison characteristics in the case where the first embodiment is applied to a PLL circuit.
Figure 9:
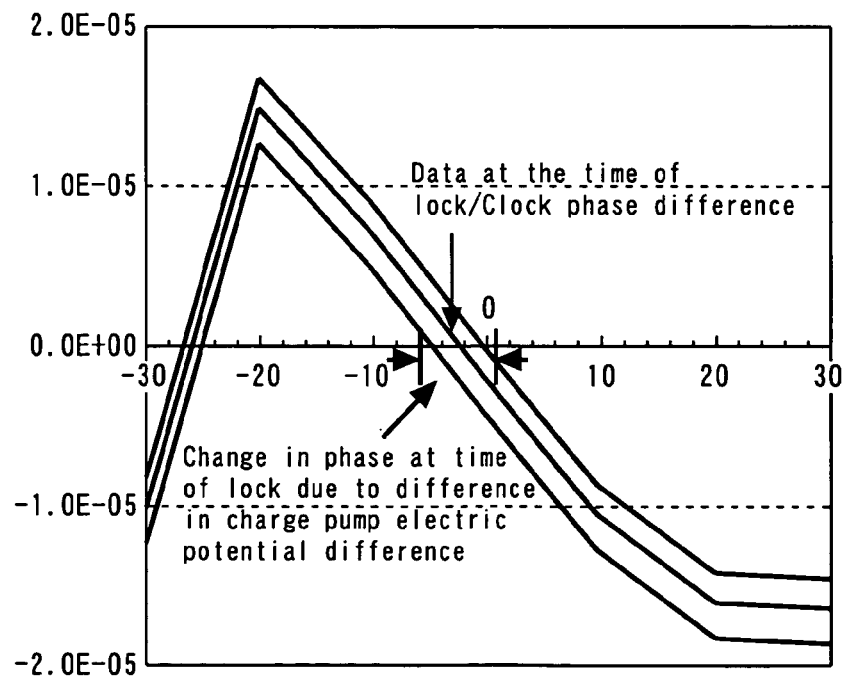
FIG. 9 is a diagram for illustrating the simulation results of phase comparison characteristics in the case where the conventional charge pump circuit is applied to a PLL circuit.

The effect has been confirmed by carrying out the simulation of phase comparison characteristics shown in FIG. 6. It has been confirmed by the simulation in FIG. 6 that the phase fluctuation of 5 ps without the offset mechanism in the simulation in FIG. 9 may be settled less than 1 ps under the same conditions.

Second Embodiment

Figure 5:
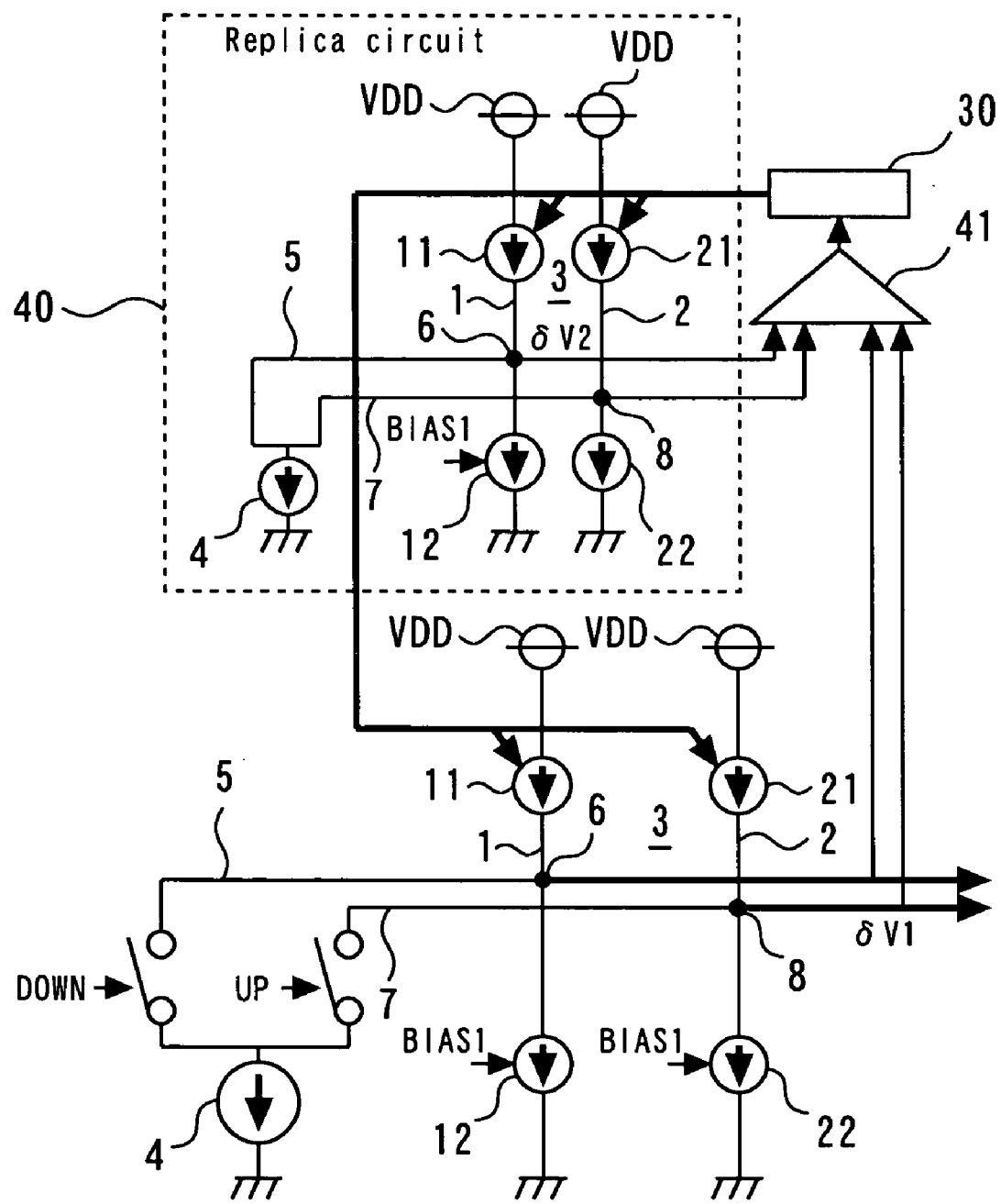
FIG. 5 is a schematic circuit diagram for illustrating the structure of a second embodiment of the present invention.

Next, the second embodiment will be explained referring to FIG. 5. FIG. 5 is a schematic circuit diagram showing the structure of the second embodiment. In FIG. 5, the same numerals are given to the same parts or the corresponding parts in FIG. 1, and repeated explanation will be appropriately omitted. FIG. 5 is different from FIG. 1 in that along with providing a replica of the differential charge pump circuit which is of the same structure as the differential charge pump circuit, the output potential difference of the differential charge pump circuit is compared with the output potential difference of the replica of the differential charge pump circuit by a comparator, and that the current sources of the differential charge pump circuit and the replica of the differential charge pump circuit are controlled so that the output potential differences thereof become equal.

FIG. 5 has the same structure as the differential charge pump circuit which includes the differential pair 3. A replica circuit 40 which replicates the circuit in the UP=DOWN state is provided; the output potential difference $\delta V1$ of the differential charge pump circuit and the output differential difference $\delta V2$ of the replica circuit 40 are inputted to the comparator 41; the compared result from the comparator 41 is fed back via the controlling device 30 to the current sources 11 and 21 of the replica circuit and the differential charge pump circuit as shown in FIG. 5; and the current values of each of the current sources are controlled by the controlling device 30 so that the output potential differences $\delta V1$ and $\delta V2$ become equal.

Accordingly, for example, in the case where $\delta V2$ is smaller than $\delta V2$, either of the current values of the current sources 11 or 21 of the replica circuit 40 are to be enlarged until $\delta V2$ becomes equal to $\delta V1$. As shown in FIG. 5, this control of the current value is also carried out in the differential charge pump circuit, which is the circuit that is actually used. Since the replica circuit 40 is a replica of a differential charge pump circuit which is constantly in the UP=DOWN state, when the PLL circuit is in a normal state and locked due to this feedback control, it is possible to say that the PLL circuit is locked because the UP signal and the DOWN signal are in balance with each other. Since the method to control the current sources of each of the two current paths by means of a replica circuit 40 may be realized regardless with adjustment depending on the performance of the transistor such as size adjustment, accurate control which is independent of devices becomes possible.

Obviously many modifications and variations of the present invention are possible in the light of the above teachings. It is therefore to be understood that within the scope of the appended claims the invention may by practiced otherwise than as specifically described.

The entire disclosure of a Japanese Patent Application No. 2004-014533, filed on Jan. 22, 2004 including specification, claims, drawings and summary, on which the Convention priority of the present application is based, are incorporated herein by reference in its entirety.

What is claimed is:

1. A differential charge pump circuit comprising:
    first and second current paths for generating a differential current in accordance with currents inputted to the two current paths, the two current paths comprising respective first and second current sources and forming a differential pair; and
    controlling means for detecting an output potential difference between the two current paths and controlling independently current values of the first and second current sources in accordance with the output potential difference,
    wherein the first and second current sources comprise first transistors, respectively, and drain voltages of the first transistors are independently controlled in accordance with the output potential difference,
    the differential charge pump circuit further comprising second transistors connected in parallel to the first transistors, respectively, wherein drains of the first and second transistors of the first current path are coupled to a gate of the second transistor of the second current path, and drains of the first and second transistors of the second current path are coupled to a gate of the second transistor of the first current path.

* * * * *